(12) United States Patent
Nisbet et al.

(10) Patent No.: US 12,381,528 B2
(45) Date of Patent: Aug. 5, 2025

(54) BIDIRECTIONAL VARIABLE GAIN AMPLIFIERS FOR RADIO FREQUENCY COMMUNICATION SYSTEMS

(71) Applicant: Skyworks Solutions, Inc., Irvine, CA (US)

(72) Inventors: John Jackson Nisbet, Ottawa (CA); Hamed Golestaneh, Stittsville (CA)

(73) Assignee: Skyworks Solutions, Inc., Irvine, CA (US)

( * ) Notice: Subject to any disclaimer, the term of this patent is extended or adjusted under 35 U.S.C. 154(b) by 505 days.

(21) Appl. No.: 17/650,425

(22) Filed: Feb. 9, 2022

(65) Prior Publication Data

US 2022/0294404 A1 Sep. 15, 2022

Related U.S. Application Data

(60) Provisional application No. 63/200,477, filed on Mar. 9, 2021.

(51) Int. Cl.
*H03G 3/30* (2006.01)
*H03F 3/24* (2006.01)
*H04B 1/40* (2015.01)

(52) U.S. Cl.
CPC ........... *H03G 3/3042* (2013.01); *H03F 3/245* (2013.01); *H04B 1/40* (2013.01);
(Continued)

(58) Field of Classification Search
CPC ........... H03G 3/3042; H03G 2201/103; H03G 2201/307; H03G 3/18; H03F 3/245;
(Continued)

(56) References Cited

U.S. PATENT DOCUMENTS 7,046,119 B2 5/2006 Ghabra et al.
8,699,973 B2 * 4/2014 Southcombe ............. H03F 3/72
455/127.2
(Continued)

FOREIGN PATENT DOCUMENTS

EP 0692163 B1 * 4/1997 ......... H04B 7/15535
WO WO 1994/023504 10/1994
WO WO 2021/041766 3/2021

OTHER PUBLICATIONS

Meng et al., "A compact 57-67 GHz bidirectional LNAPA in 65-nm CMOS technology", IEEE Microwave and Wireless Components Letters, vol. 26(8):628-630 (2016).
(Continued)

*Primary Examiner* — Yuwen Pan
*Assistant Examiner* — Swati Jain
(74) *Attorney, Agent, or Firm* — Knobbe, Martens, Olson and Bear, LLP (57) ABSTRACT

Bidirectional variable gain amplifiers (VGAs) for radio frequency (RF) communication systems are provided. In certain embodiments, a bidirectional VGA includes a first amplifier having an input coupled to a transmit/receive port, a second amplifier having an output coupled to a transmit port, a third amplifier having an input coupled to a receive port, a fourth amplifier having an output coupled to the transmit/receive port and to the input of the first amplifier, and a switch circuit that connects an output of the first amplifier to an input of the second amplifier in a transmit mode, and that connects an output of the third amplifier to an input of the fourth amplifier in a receive mode.

18 Claims, 8 Drawing Sheets

(52) U.S. Cl.
CPC .. *H03F 2200/294* (2013.01); *H03F 2200/451* (2013.01); *H03G 2201/103* (2013.01); *H03G 2201/307* (2013.01)

(58) Field of Classification Search
CPC ......... H03F 2200/294; H03F 2200/451; H03F 2200/72; H03F 2203/45556; H03F 3/19; H03F 1/26; H03F 3/193; H03F 3/211; H03F 3/45179; H03F 3/62; H03F 1/0211; H03F 3/24; H04B 1/40; H04B 1/48; H04B 1/44; H04B 1/54; H01Q 3/28
See application file for complete search history.

(56) References Cited

U.S. PATENT DOCUMENTS

| | | | | |
|---|---|---|---|---|
| 8,706,063 | B2* | 4/2014 | Honjo | H03F 3/72 455/108 |
| 8,731,498 | B2* | 5/2014 | Southcombe | H03F 3/72 455/343.5 |
| 8,811,921 | B2* | 8/2014 | Jones | H03F 1/0227 330/285 |
| 8,831,544 | B2* | 9/2014 | Walker | H03F 3/68 455/127.1 |
| 9,077,405 | B2* | 7/2015 | Jones | H03F 1/0227 |
| 9,118,113 | B2 | 8/2015 | Mortazawi et al. | |
| 9,425,853 | B2* | 8/2016 | Heikkinen | H04B 1/005 |
| 9,553,550 | B2* | 1/2017 | Puliafico | H03F 3/195 |
| 9,577,590 | B2* | 2/2017 | Levesque | H03F 3/21 |
| 9,900,204 | B2* | 2/2018 | Levesque | H03F 3/195 |
| 10,256,865 | B2 | 4/2019 | Perumana et al. | |
| 10,848,116 | B2* | 11/2020 | Wu | H03G 1/0088 |
| 10,971,799 | B2 | 4/2021 | Lee et al. | |
| 11,063,355 | B2* | 7/2021 | Wu | H04B 1/44 |
| 11,158,945 | B2* | 10/2021 | Tokgoz | H01Q 21/24 |
| 11,316,489 | B2 | 4/2022 | Patel et al. | |
| 11,322,837 | B2 | 5/2022 | Tiebout et al. | |
| 2002/0101225 | A1* | 8/2002 | Oyrer | G05F 3/262 323/315 |
| 2004/0212020 | A1* | 10/2004 | Sjostrom | H01L 27/088 257/E27.06 |
| 2007/0216383 | A1* | 9/2007 | Al-Shyoukh | G05F 1/468 323/280 |
| 2008/0174446 | A1 | 7/2008 | Ghabra et al. | |
| 2009/0036065 | A1* | 2/2009 | Siu | H03F 3/72 455/78 |
| 2019/0273475 | A1* | 9/2019 | Ye | H03F 1/26 |
| 2020/0076302 | A1* | 3/2020 | Zhuang | H02M 7/4837 |
| 2020/0319327 | A1* | 10/2020 | Tsvelykh | G01S 13/933 |
| 2020/0350679 | A1* | 11/2020 | Yu | H01P 1/18 |
| 2021/0067118 | A1* | 3/2021 | Patel | H01Q 21/0025 |
| 2021/0175589 | A1* | 6/2021 | Patel | H03H 11/20 |
| 2021/0257319 | A1* | 8/2021 | Hsiao | H01L 29/66462 |

OTHER PUBLICATIONS

Pang et al., "A 28.16-Gb/s area-efficient 60-GHz CMOS bidirectional transceiver for IEEE 802.11ay", IEEE Transactions on Microwave Theory and Techniques, vol. 68(10:252-263 (2020).

* cited by examiner

BIDIRECTIONAL VARIABLE GAIN AMPLIFIERS FOR RADIO FREQUENCY COMMUNICATION SYSTEMS

CROSS-REFERENCE TO RELATED APPLICATIONS

This application claims the benefit of priority under 35 U.S.C. § 119 of U.S. Provisional Patent Application No. 63/200,477, filed Mar. 9, 2021 and titled "BIDIRECTIONAL VARIABLE GAIN AMPLIFIERS FOR RADIO FREQUENCY COMMUNICATION SYSTEMS," which is herein incorporated by reference in its entirety.

BACKGROUND

Technical Field

Embodiments of the invention relate to electronic systems, and in particular, to radio frequency (RF) electronics.

Description of the Related Technology

Variable gain amplifiers (VGAs) are used in RF communication systems to provide a controllable amount of amplification to RF signals that are transmitted or received wirelessly using antennas.

Examples of RF communication systems that can include one or more VGAs include, but are not limited to, mobile phones, tablets, base stations, network access points, customer-premises equipment (CPE), laptops, and wearable electronics. An RF signal can have a frequency in the range of about 30 kHz to 300 GHz, such as in the range of about 425 MHz to about 7.125 GHz for Frequency Range 1 (FR1) of the Fifth Generation (5G) communication standard or in the range of about 24.250 GHz to about 52.600 GHz for Frequency Range 2 (FR2) of the 5G communication standard.

SUMMARY

In certain embodiments, the present disclosure relates to a wireless device. The wireless device includes an antenna array including a plurality of antenna elements, a plurality of radio frequency signal conditioning circuits each operatively associated with a corresponding one of the plurality of antenna elements and including a bidirectional variable gain amplifier, and a transceiver electrically coupled to the plurality of radio frequency signal conditioning circuits. The bidirectional variable gain amplifier includes a first amplifier including an input coupled to a transmit/receive port, a second amplifier including an output coupled to a transmit port, a third amplifier including an input coupled to a receive port, a fourth amplifier including an output coupled to the transmit/receive port and to the input of the first amplifier, and a switch circuit configured to connect an output of the first amplifier to an input of the second amplifier in a transmit mode, and to connect an output of the third amplifier to an input of the fourth amplifier in a receive mode.

In various embodiments, the first amplifier is a first common-gate amplifier and the fourth amplifier is a first common-drain amplifier. According to a number of embodiments, the second amplifier is a second common-gate amplifier, and the third amplifier is a second common-drain amplifier.

In several embodiments, the first amplifier includes a first pair of transistors having a first pair of sources, and the second amplifier includes a second pair of transistors having a second pair of sources directly connected to the first pair of sources.

In some embodiments, the switch circuit includes a first switch and a second switch connected at a common node, the bidirectional variable gain amplifier further including a controllable resistor connected to the common node.

In various embodiments, at least one of the first amplifier or the third amplifier includes a first pair of input transistors and a second pair of input transistors that are selectable, the first pair of input transistors configured to provide a signal inversion when selected and the second pair of input transistors configured to provide no signal inversion when selected.

In several embodiments, each of the plurality of radio frequency signal conditioning circuits further includes a phase shifter connected to the transmit/receive port.

In some embodiments, each of the plurality of radio frequency signal conditioning circuits further includes a power amplifier having an input connected to the transmit port and a low noise amplifier having an output connected to the receive port.

In certain embodiments, the present disclosure relates to a bidirectional variable gain amplifier. The bidirectional variable gain amplifier includes a first amplifier including an input coupled to a transmit/receive port, a second amplifier including an output coupled to a transmit port, a third amplifier including an input coupled to a receive port, a fourth amplifier including an output coupled to the transmit/receive port and to the input of the first amplifier, and a switch circuit configured to connect an output of the first amplifier to an input of the second amplifier in a transmit mode, and to connect an output of the third amplifier to an input of the fourth amplifier in a receive mode.

In some embodiments, the first amplifier is a first common-gate amplifier and the fourth amplifier is a first common-drain amplifier. According to a number of embodiments, the second amplifier is a second common-gate amplifier, and the third amplifier is a second common-drain amplifier.

In several embodiments, the first amplifier includes a first pair of transistors having a first pair of sources, and the second amplifier includes a second pair of transistors having a second pair of sources directly connected to the first pair of sources. According to a number of embodiments, the bidirectional variable gain amplifier further includes a pair of inductors connected to the first pair of sources and the second pair of sources, the pair of inductors configured to provide input matching to the first amplifier and output matching to the fourth amplifier.

In some embodiments, the switch circuit includes a first switch and a second switch connected at a common node. According to various embodiments, the bidirectional variable gain amplifier further includes a controllable resistor connected to the common node.

In a number of embodiments, at least one of the first amplifier or the third amplifier includes a first pair of input transistors and a second pair of input transistors that are selectable, the first pair of input transistors configured to provide a signal inversion when selected and the second pair of input transistors configured to provide no signal inversion when selected.

In several embodiments, the bidirectional variable gain amplifier further includes a bias and control circuit configured turn off the third amplifier and the fourth amplifier in the transmit mode, and to turn off the first amplifier and the second amplifier in the receive mode.

In certain embodiments, the present disclosure relates to a front end system. The front end system includes a power amplifier, a low noise amplifier, and a bidirectional variable gain amplifier including a first amplifier having an input coupled to a transmit/receive port, a second amplifier having an output coupled to an input of the power amplifier at a transmit port, a third amplifier having an input coupled to an output of the low noise amplifier at a receive port, a fourth amplifier having an output coupled to the transmit/receive port and to the input of the first amplifier, and a switch circuit configured to connect an output of the first amplifier to an input of the second amplifier in a transmit mode, and to connect an output of the third amplifier to an input of the fourth amplifier in a receive mode.

In various embodiments, the first amplifier is a first common-gate amplifier and the fourth amplifier is a first common-drain amplifier. According to several embodiments, the second amplifier is a second common-gate amplifier, and the third amplifier is a second common-drain amplifier.

In a number of embodiments, the first amplifier includes a first pair of transistors having a first pair of sources, and the second amplifier includes a second pair of transistors having a second pair of sources directly connected to the first pair of sources.

In several embodiments, the switch circuit includes a first switch and a second switch connected at a common node, the bidirectional variable gain amplifier further including a controllable resistor connected to the common node.

In various embodiments, at least one of the first amplifier or the third amplifier includes a first pair of input transistors and a second pair of input transistors that are selectable, the first pair of input transistors configured to provide a signal inversion when selected and the second pair of input transistors configured to provide no signal inversion when selected.

In some embodiments, the front end system further includes a phase shifter connected to the transmit/receive port.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and introduced Phase 2 of 5G technology in Release 16. Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

Figure 1:
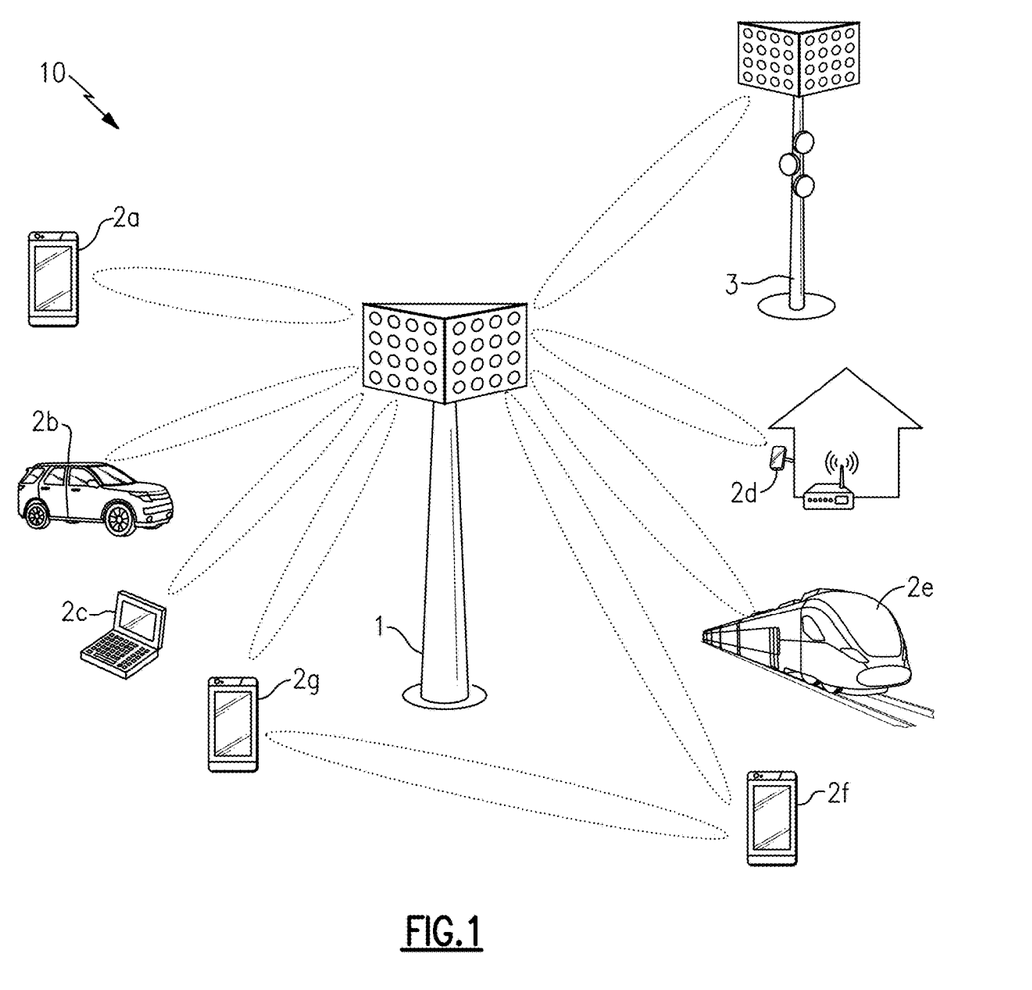
FIG. 1 is a schematic diagram of one example of a communication network.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, a second mobile device 2f, and a third mobile device 2g.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 10 can be implemented to support self-fronthaul and/or self-backhaul (for instance, as between mobile device 2g and mobile device 2f).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

Figure 2A:
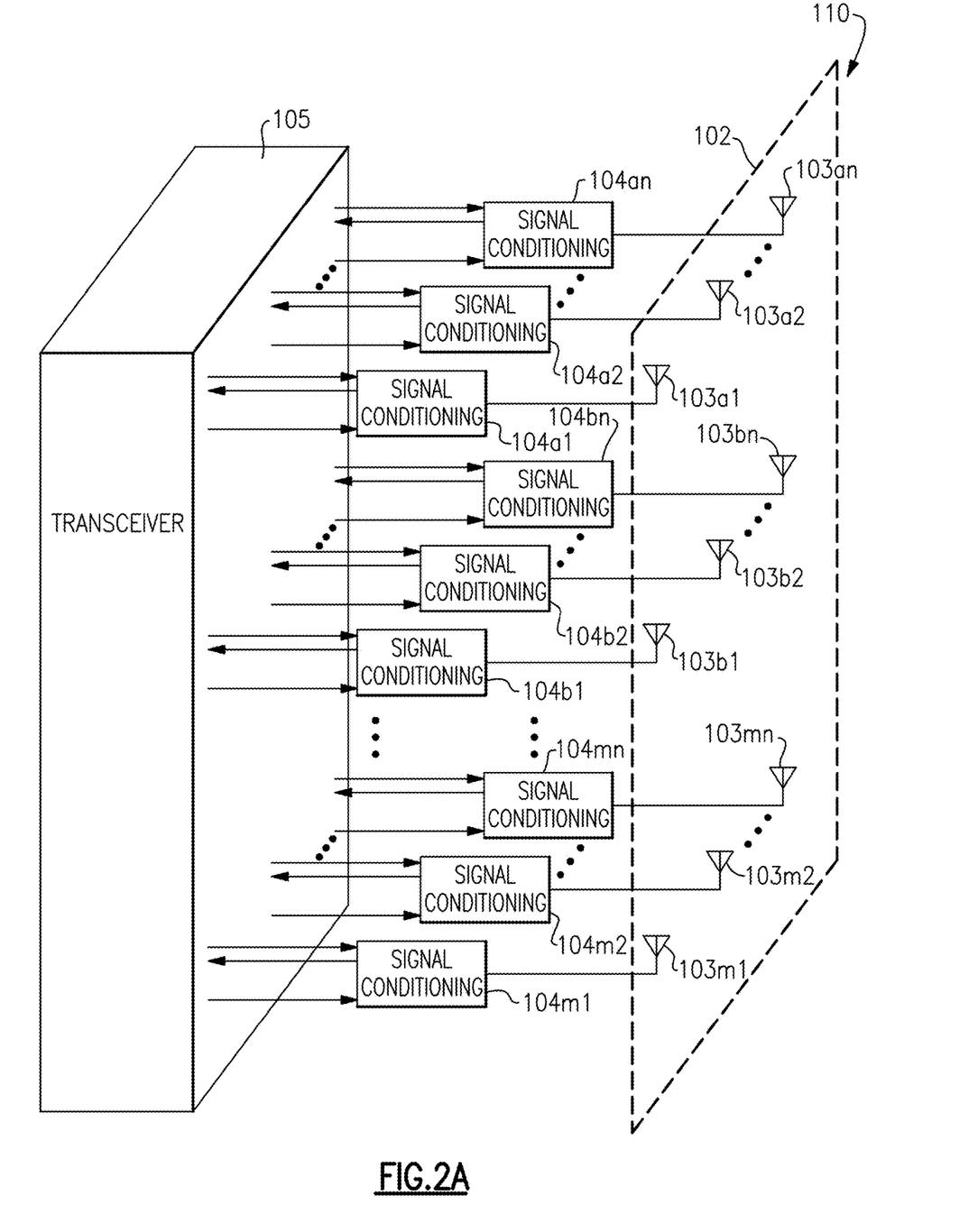
FIG. 2A is a schematic diagram of one embodiment of a communication system that operates with beamforming.

FIG. 2A is a schematic diagram of one embodiment of a communication system 110 that operates with beamforming. The communication system 110 includes a transceiver 105, RF signal conditioning circuits 104a1, 104a2 ... 104an, 104b1, 104b2 ... 104bn, 104m1, 104m2 ... 104mn, and an antenna array 102 that includes antenna elements 103a1, 103a2 ... 103an, 103b1, 103b2 ... 103bn, 103m1, 103m2 ... 103mn.

Communications systems that communicate using millimeter wave carriers, centimeter wave carriers, and/or other frequency carriers can employ an antenna array such as the antenna array 102 to provide beam formation and directivity for transmission and/or reception of signals.

For example, in the illustrated embodiment, the communication system 110 includes an array 102 of m×n antenna elements, each of which are coupled to a separate RF signal conditioning circuit, in this embodiment. As indicated by the ellipses, the communication system 110 can be implemented with any suitable number of antenna elements and RF signal conditioning circuits.

With respect to signal transmission, the RF signal conditioning circuits 104a1, 104a2 ... 104an, 104b1, 104b2 ... 104bn, 104m1, 104m2 ... 104mn can provide transmit signals to the antenna array 102 such that signals radiated from the antenna elements combine using constructive and destructive interference to generate an aggregate transmit signal exhibiting beam-like qualities with more signal strength propagating in a given direction away from the antenna array 102.

In the context of signal reception, the RF signal conditioning circuits 104a1, 104a2 ... 104an, 104b1, 104b2 ... 104bn, 104m1, 104m2 ... 104mn process the received signals (for instance, by separately controlling received signal phases) such that more signal energy is received when the signal is arriving at the antenna array 102 from a particular direction. Accordingly, the communication system 110 also provides directivity for reception of signals.

The relative concentration of signal energy into a transmit beam or a receive beam can be enhanced by increasing the size of the array. For example, with more signal energy focused into a transmit beam, the signal is able to propagate for a longer range while providing sufficient signal level for RF communications. For instance, a signal with a large proportion of signal energy focused into the transmit beam can exhibit high effective isotropic radiated power (EIRP).

In the illustrated embodiment, the transceiver 105 provides transmit signals to the RF signal conditioning circuits 104a1, 104a2 ... 104an, 104b1, 104b2 ... 104bn, 104m1, 104m2 ... 104mn and processes signals received from the RF signal conditioning circuits.

As shown in FIG. 2A, the transceiver 105 generates control signals for the RF signal conditioning circuits 104a1, 104a2 ... 104an, 104b1, 104b2 ... 104bn, 104m1, 104m2 ... 104mn. The control signals can be used for a variety of functions, such as controlling the gain and phase of transmitted and/or received signals to control beamforming. For example, each of the RF signal conditioning circuits 104a1, 104a2 ... 104an, 104b1, 104b2 ... 104bn, 104m1, 104m2 ... 104mn can include a phase shifter and a bidirectional VGA implemented in accordance with the teachings herein.

Figure 2B:
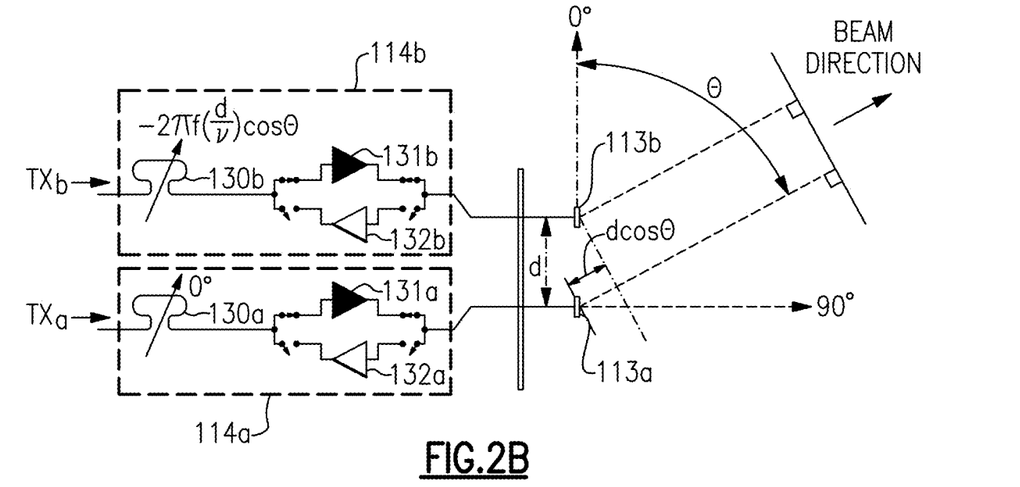
FIG. 2B is a schematic diagram of one embodiment of beamforming to provide a transmit beam.

FIG. 2B is a schematic diagram of one embodiment of beamforming to provide a transmit beam. FIG. 2B illustrates a portion of a communication system including a first RF signal conditioning circuit 114a, a second RF signal conditioning circuit 114b, a first antenna element 113a, and a second antenna element 113b.

Although illustrated as included two antenna elements and two RF signal conditioning circuits, a communication system can include additional antenna elements and/or signal conditioning circuits. For example, FIG. 2B illustrates one embodiment of a portion of the communication system 110 of FIG. 2A.

The first RF signal conditioning circuit 114a includes a first phase shifter 130a, a first power amplifier 131a, a first low noise amplifier (LNA) 132a, and switches for controlling selection of the power amplifier 131a or LNA 132a. Additionally, the second RF signal conditioning circuit 114b includes a second phase shifter 130b, a second power amplifier 131b, a second LNA 132b, and switches for controlling selection of the power amplifier 131b or LNA 132b.

Although one embodiment of RF signal conditioning circuits is shown, other implementations of RF signal conditioning circuits are possible. For instance, a signal conditioning circuit can include one or more band filters, VGAs, duplexers, diplexers, and/or other components.

In the illustrated embodiment, the first antenna element 113a and the second antenna element 113b are separated by a distance d. Additionally, FIG. 2B has been annotated with an angle θ, which in this example has a value of about 90° when the transmit beam direction is substantially perpendicular to a plane of the antenna array and a value of about 0° when the transmit beam direction is substantially parallel to the plane of the antenna array.

By controlling the relative phase of the transmit signals provided to the antenna elements 113a, 113b, a desired transmit beam angle θ can be achieved. For example, when the first phase shifter 130a has a reference value of 0°, the second phase shifter 130b can be controlled to provide a phase shift of about −2πf(d/v)cos θ radians, where f is the fundamental frequency of the transmit signal, d is the distance between the antenna elements, v is the velocity of the radiated wave, and π is the mathematic constant pi.

In certain implementations, the distance d is implemented to be about ½λ, where λ is the wavelength of the fundamental component of the transmit signal. In such implementations, the second phase shifter 130b can be controlled to provide a phase shift of about −π cos θ radians to achieve a transmit beam angle θ.

Accordingly, the relative phase of the phase shifters 130a, 130b can be controlled to provide transmit beamforming. In certain implementations, a transceiver (for example, the transceiver 105 of FIG. 2A) controls phase values of one or more phase shifters to control beamforming.

Figure 2C:
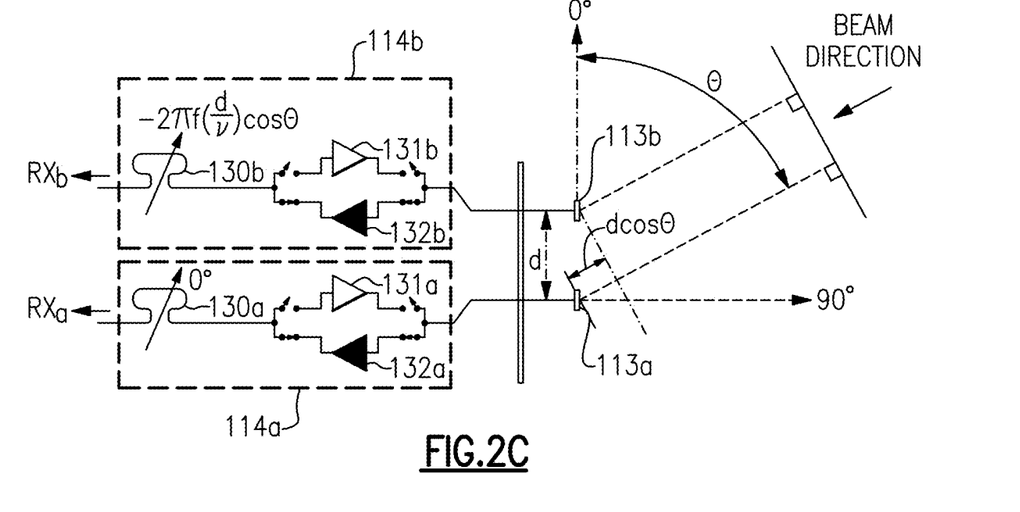
FIG. 2C is a schematic diagram of one embodiment of beamforming to provide a receive beam.

FIG. 2C is a schematic diagram of one embodiment of beamforming to provide a receive beam. FIG. 2C is similar to FIG. 2B, except that FIG. 2C illustrates beamforming in the context of a receive beam rather than a transmit beam.

As shown in FIG. 2C, a relative phase difference between the first phase shifter 130a and the second phase shifter 130b can be selected to about equal to −2πf(d/v)cos θ radians to achieve a desired receive beam angle θ. In implementations in which the distance d corresponds to about ½λ, the phase difference can be selected to about equal to −π cos θ radians to achieve a receive beam angle θ.

Although various equations for phase values to provide beamforming have been provided, other phase selection values are possible, such as phase values selected based on implementation of an antenna array, implementation of RF signal conditioning circuits, and/or a radio environment.

Bidirectional VGAs for RF Communication Systems

Antenna arrays can be used to transmit and/or receive radio frequency (RF) signals in base stations, network access points, mobile phones, tablets, customer-premises equipment (CPE), laptops, computers, wearable electronics, and/or other communication devices. For example, communication devices that utilize millimeter wave carriers (for instance, 30 GHz to 300 GHz), centimeter wave carriers (for instance, 3 GHz to 30 GHz), and/or other carrier frequencies can employ an antenna array to provide beam formation and directivity for transmission and/or reception of signals.

In the context of signal transmission, the signals from the antenna elements of the antenna array combine using constructive and destructive interference to generate an aggregate transmit signal exhibiting beam-like qualities with more signal strength propagating in a given direction away from the antenna array. In the context of signal reception, more signal energy is received by the antenna array when the signal is arriving from a particular direction. Accordingly, an antenna array can also provide directivity for reception of signals.

Thus, many millimeter-wave (mmW) systems can use multi-element antenna arrays to generate steerable beams in which transmitter or receiver gain is enhanced in particular spatial directions at the expense of other directions. Beam steering improves both path loss and robustness to interference. The direction and width of the beam are controlled by arranging the relative phase and magnitude of the transmitter or receiver signal at each antenna.

An RF signal conditioning circuit can be used to condition a transmit signal for transmission via an antenna element of an antenna array and/or to condition a received signal from the antenna element to thereby achieve desired gain and phase. Such RF signal conditioning circuits can include at least one phase shifter for providing controllable phase adjustment to an RF signal associated with a particular antenna element and at least one variable gain amplifier (VGA) for providing controllable gain adjustment to the RF signal. To provide flexibility for beamforming, it is desirable that available phase adjustment for phase shifting span a wide angular range, for instance, a full 360°. The RF signal conditioning circuits can further include other circuitry, such as a power amplifier for amplifying a signal for transmission and/or a low noise amplifier (LNA) for amplifying a received signal while introducing a relatively small amount of noise.

For gain control, an RF signal conditioning circuit can include a transmit VGA and a power amplifier in cascade for amplifying an RF transmit signal for transmission on an antenna element, and an LNA and a receive VGA in cascade for amplifying an RF receive signal received from the antenna element. The transmit VGA/power amplifier or the LNA/receive LNA can be selected using a pair of transmit/receive switches.

For phase control, a coarse phase shifter and a fine phase shifter can be cascaded and used for phase shifting the RF transmit signal or the RF receive signal. In certain implementations, the coarse phase shifter provides phase swapping (a 0° shift or a 180° shift), while the fine phase shifter allows for fine gain control steps spanning a 180° range. Thus, the combination of a coarse phase shifter and a fine phase shifter can provide phase shifting over a full 360° range.

To reduce die area, it is desirable for a transmit VGA and a receive VGA to be combined into a single bidirectional VGA that can be used to amplify either the RF transmit signal or the RF receive signal. Not only can such a configuration reduce die area, but also eliminate one of the transmit/receive switches to reduce loss.

Figure 3:
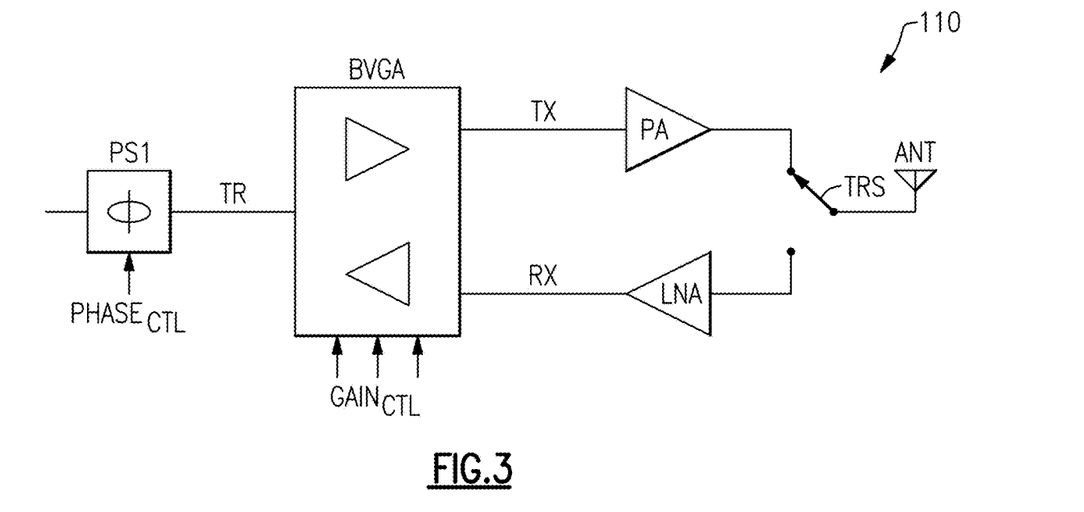
FIG. 3 is a schematic diagram of a radio frequency (RF) signal conditioning circuit according to one embodiment.

FIG. 3 is a schematic diagram of an RF signal conditioning circuit 110 according to one embodiment. The RF signal conditioning circuit 110 includes a fine phase shifter PS1, a bidirectional VGA (BVGA), a power amplifier (PA), a low noise amplifier (LNA), an antenna ANT, and a transmit/receive switch TRS.

The antenna ANT is coupled to an antenna terminal of the transmit/receive switch TRS. The antenna ANT can correspond to an antenna element of a larger antenna array (for example, the antenna array 102 of FIG. 2A) used for beamforming. As shown in FIG. 3, a transmit terminal and a receive terminal of the transmit/receive switch TRS are connected to an output of the PA and an input of the LNA, respectively. The PA receives a transmit signal TX from the BVGA, while the LNA provides a receive signal RX to the BVGA. The gain of the VGA is controlled by a gain control signal $GAIN_{CTL}$. Signal TR can correspond either to an input transmit signal provided to the BVGA in a transmit mode, or to an amplified receive signal outputted by the BVGA in a receive mode. The signal TR is phase shifted by the fine phase shifter PS1, which is controlled by the phase control signal $PHASE_{CTL}$.

The RF signal conditioning circuit 110 provides reduced die area relative to a configuration with a separate transmit VGA and a separate receive VGA. Moreover, the RF signal conditioning circuit 110 includes only one transmit/receive switch, and thus operates with low switch loss relative to a configuration using a pair of transmit/receive switches for selecting a transmit VGA/PA or selecting an LNA/receive VGA.

Figure 4:
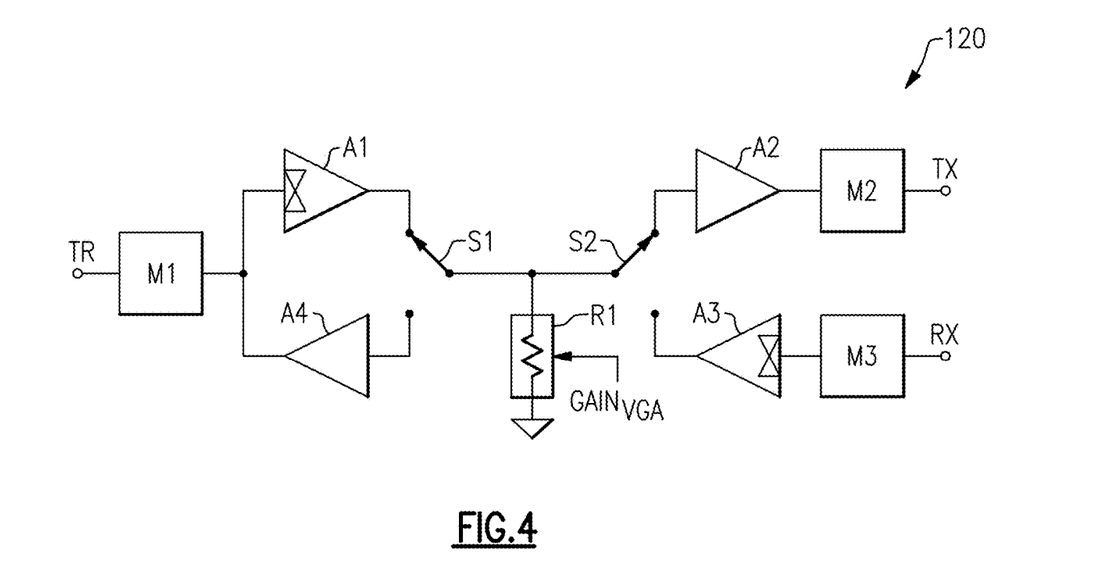
FIG. 4 is a schematic diagram of a bidirectional variable gain amplifier (VGA) according to one embodiment.

FIG. 4 is a schematic diagram of a bidirectional VGA 120 according to one embodiment. The bidirectional VGA 120 includes a first matching network M1, a second matching network M2, a third matching network M3, a first amplifier A1, a second amplifier A2, a third amplifier A3, a fourth amplifier A4, a first switch S1, a second switch S2, and a controllable resistor R1. The bidirectional VGA 120 further includes a TR port, a TX port, and an RX port.

The TR port can be connected to a fine phase shifter (for example, PS1 of FIG. 3) that can provide 0° to 180° phase shifting (for instance, in fine steps or increments based on a phase control signal). The first matching network M1 is used for matching both an input of the first amplifier A1 and an output of the fourth amplifier A4.

In a transmit mode, the second amplifier A2 and the second matching network M2 direct a signal from the first amplifier A1 to the TX port. In a receive mode, the third amplifier A3 and the third matching network M3 receive the receive signal from the RX port and direct it toward the TR port by way of the fourth amplifier A4. A switch circuit (including switch S1 and switch S2, in this example) controls connection of the output of the first amplifier A1 to the input of the second amplifier A2 in the transmit mode, and connection of the output of the third amplifier A3 to the input of the fourth amplifier A4 in the receive mode.

In certain implementations, the first amplifier A1 is a common-gate (CG) amplifier and the second amplifier A4 is a common-drain (CD) amplifier. By implementing the first amplifier A1 and the fourth amplifier A4 in this manner, the source terminals of the amplifiers A1 and A4 can simply be connected together, and the first matching network M1 can be implemented as an arrangement of two inductors and two capacitors. If the first amplifier A1 is suitably disabled it does not interfere with operation of the fourth amplifier A4, and vice versa. Furthermore, by selecting field-effect transistor (FET) sizes and bias conditions appropriately, the first matching network M1 can provide matching of both the input of the first amplifier A1 and the output of the fourth amplifier A4.

In certain implementations, the second amplifier A2 is a CD amplifier, and the third amplifier A3 is a CG amplifier. For example, the second amplifier A2 can be a replica of the fourth amplifier A4, while the third amplifier A3 can be a replica of the first amplifier A1. Implementing the amplifiers in this manner aid in matching transmit and receive gain magnitude, phase, and/or group delay. To further enhance such matching the second matching network M2 and the third matching network M3 can correspond to a replica of the first matching network M1, thereby providing less group delay variation over frequency compared to the networks used for a configuration using a cascode amplifier.

Moreover, using CD and CG amplifiers avoids the use of cascode amplifiers, which can use large matching inductors and/or have inadequate output compression point when the supply voltage is low. For example, when using a cascode amplifier, ports of the VGA can be connected to high capacitance FET gates, thus necessitating the use of large matching inductors. In contrast, using CD and CG amplifiers allows the VGA's ports to be connected to FET sources having relatively low capacitance compared to FET gates.

Figure 5:
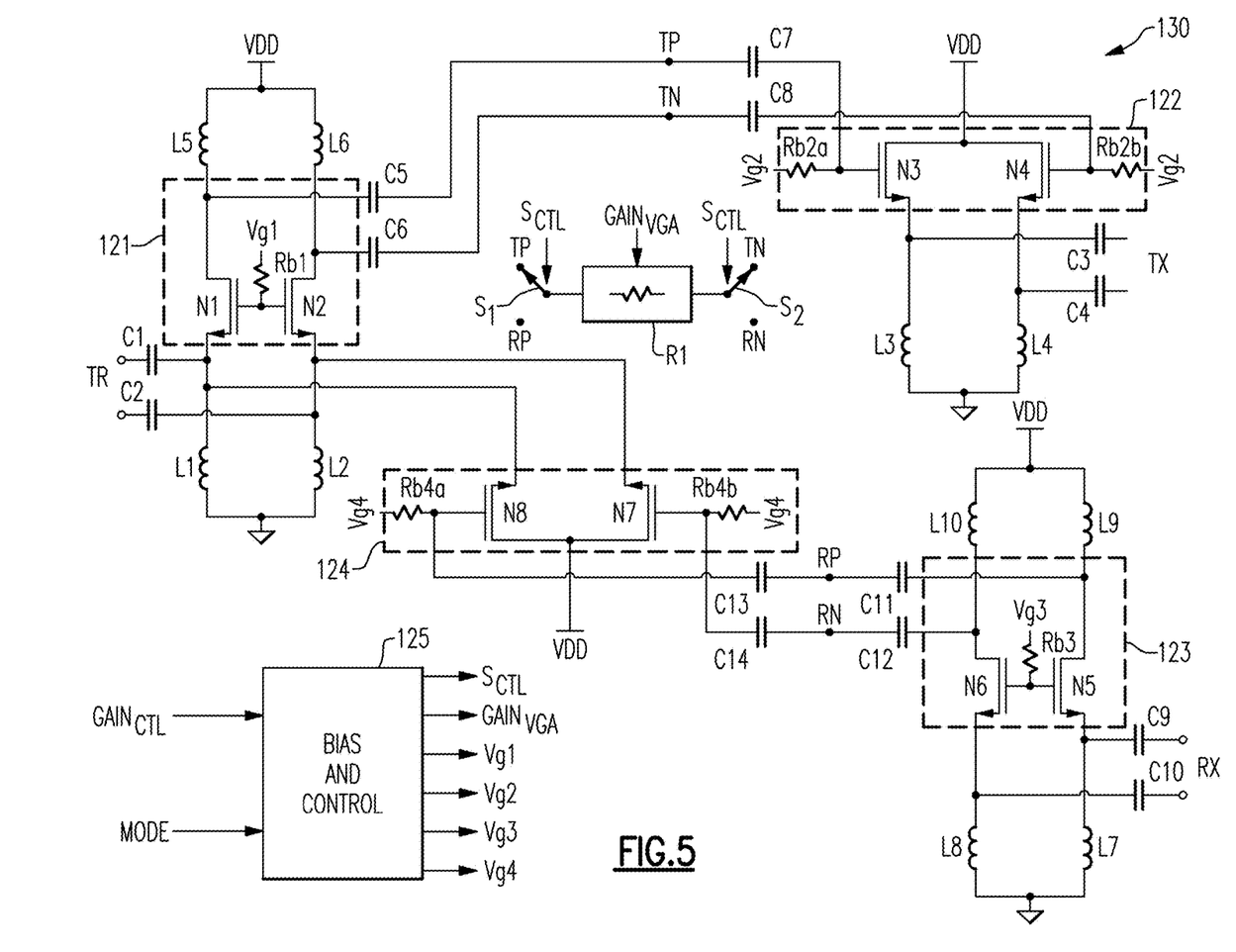
FIG. 5 is a schematic diagram of a bidirectional VGA according to another embodiment.

FIG. 5 is a schematic diagram of a bidirectional VGA 130 according to another embodiment. The bidirectional VGA 130 includes a first amplifier 121, a second amplifier 122, a third amplifier 123, a fourth amplifier 124, a bias and control circuit 125, a controllable resistor R1, a first switch S1, a second switch S2, a first capacitor C1, a second capacitor C2, a third capacitor C3, a fourth capacitor C4, a fifth capacitor C5, a sixth capacitor C6, a seventh capacitor C7, an eight capacitor C8, a ninth capacitor C9, a tenth capacitor C10, an eleventh capacitor C11, a twelfth capacitor C12, a thirteenth capacitor C13, a fourteenth capacitor C14, a first inductor L1, a second inductor L2, a third inductor L3, a fourth inductor L4, a fifth inductor L5, a sixth inductor L6, a seventh inductor L7, an eight inductor L8, a ninth inductor L9, and a tenth inductor L10. The bidirectional VGA 130 further includes a differential TR port, a differential TX port, and a differential RX port.

The first amplifier 121 includes bias resistor Rb1, transistor N1, and transistor N2 and uses inductors L5 and L6 as loads. The first amplifier 121 is implemented as a CG amplifier controlled by a first gate bias voltage Vg1 from the bias and control circuit 125.

The second amplifier 122 includes bias resistor RB2$a$, bias resistor RB2$b$, transistor N3, and transistor N4. The second amplifier 122 is implemented as a CD amplifier controlled by a second gate bias voltage Vg2 from the bias and control circuit 125.

The third amplifier 123 includes bias resistor Rb3, transistor N5, and transistor N6 and uses inductors L9 and L10 as loads. The third amplifier 123 is implemented as a CG amplifier controlled by a third gate bias voltage Vg3 from the bias and control circuit 125.

The fourth amplifier 124 includes bias resistor Rb4$a$, bias resistor Rb4$b$, transistor N7, and transistor N8. The fourth amplifier 124 is implemented as a CD amplifier controlled by a fourth gate bias voltage Vg4 from the bias and control circuit 125.

As shown in FIG. 5, the bias and control circuit 125 receives a gain control signal $GAIN_{CTL}$ for setting a gain of the bidirectional VGA 130 and a mode signal MODE for indicating a transmit mode or a receive mode. However, other configurations of controlling the bidirectional VGA 130 are possible.

In this embodiment, the bias and control circuit 125 generates Vg1, Vg2, Vg3, and Vg4 for biasing the amplifiers A1, A2, A3, and A4, respectively, as well as to selectively enable the amplifiers based on whether the bidirectional VGA 130 is operating in the transmit mode or the receive mode. The bias and control circuit 125 also generates a gain signal $GAIN_{VGA}$ for controlling a resistance of the resistor R1 to change the bidirectional VGA's gain setting, and a switch control signal $S_{CTL}$ for controlling the switches S1 and S2.

Transistors N1 and N2 (operating together with load inductors L5 and L6) form the CG input amplifier for the transmit direction. Inductors L1 and L2 and capacitors C1 and C2 form the matching network for the TR port. Additionally, capacitors C5, C6, C7 and C8 operate as DC blocking capacitors used to isolate the DC bias of the variable resistor R1 from the depicted CG and CD amplifiers. Transistors N3 and N4 form the output CD stage together for the transmit direction. A matching network for the TX port includes inductors L3 and L4 and capacitors C3 and C4.

In the receive direction, transistors N5 and N6 with inductors L9 and L10 form the CG input amplifier and transistors N7 and N8 form the output CD amplifier. In the illustrated embodiment, the sources of transistors N7 and N8 connect directly to the sources of transistors N1 and N2, respectively, and these four FETs share the TR port matching network. Accordingly, there is no need for an explicit transmit-receive switch. Thus, reduced loss and smaller area is achieved.

Moreover, the use of CG and CD amplifiers as shown in FIG. 5 provides fairly good isolation between RF ports, and the RF port impedances have little to no variation with respect to the setting of the variable resistor R1. Since the CG and CD amplifiers avoid stacked devices (as compared to cascode amplifiers), they allow for large output voltage swing and excellent output compression point which is particularly desirable in applications with low supply voltage (VDD).

Accordingly, the bidirectional VGA 130 of FIG. 5 can exhibit a number of advantages including, but not limited to small die area, low loss, wideband matching of termination impedances, gain flatness, low group delay variation, and/or higher output 1 dB compression point (OP1$d$B) from a low power supply voltage.

Figure 6:
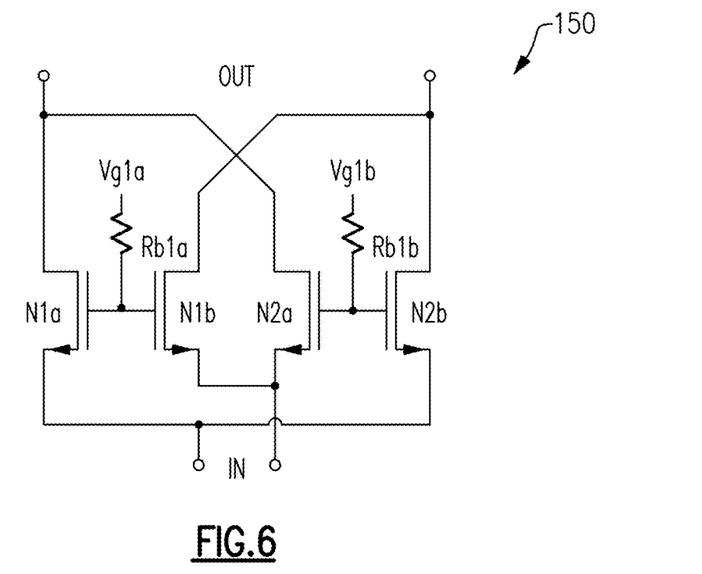
FIG. 6 is a schematic diagram of a coarse phase shifter according to one embodiment.

FIG. 6 is a schematic diagram of a coarse phase shifter 150 according to one embodiment. The coarse phase shifter 150 incudes a transistor N1$a$, a transistor N1$b$, a transistor N2$a$, a transistor N2$b$, a bias resistor Rb1$a$, and a bias resistor Rb1$b$. The coarse phase shifter 150 includes a differential input port IN and a differential output port OUT. The gate bias voltage Vg1$a$ biases the gates of transistor N1$a$ and transistor N1$b$, while the gate bias voltage Vg1$b$ biases the gates of transistor N2$a$ and transistor N2$b$.

The coarse phase shifter 150 can replace the input transistor pair of a CG amplifier, such as that of the first amplifier A1 and/or the third amplifier A3 of FIG. 5, to provide flexibility for providing a 180° phase shift as desired.

Thus, phase swapping can be accomplished easily in a bidirectional VGA when using a differential signal path throughout. For example, each of the first amplifier A1 and the third amplifier A3 can be implemented as two FET pairs with cross-connected drains as shown in FIG. 6 (rather than a single FET pair). Phase swapping is accomplished by enabling one or the other FET pair according to the desired phase shift (0° or 180°).

For example, if Vg1a is high and Vg1b is low, transistors N1a and N1b will conduct and the amplifier is non-inverting (0° phase shift). However, if Vg1b is high and Vg1a is low, transistors N2a and N2b will conduct and the amplifier will invert (180° phase shift).

Figure 7:
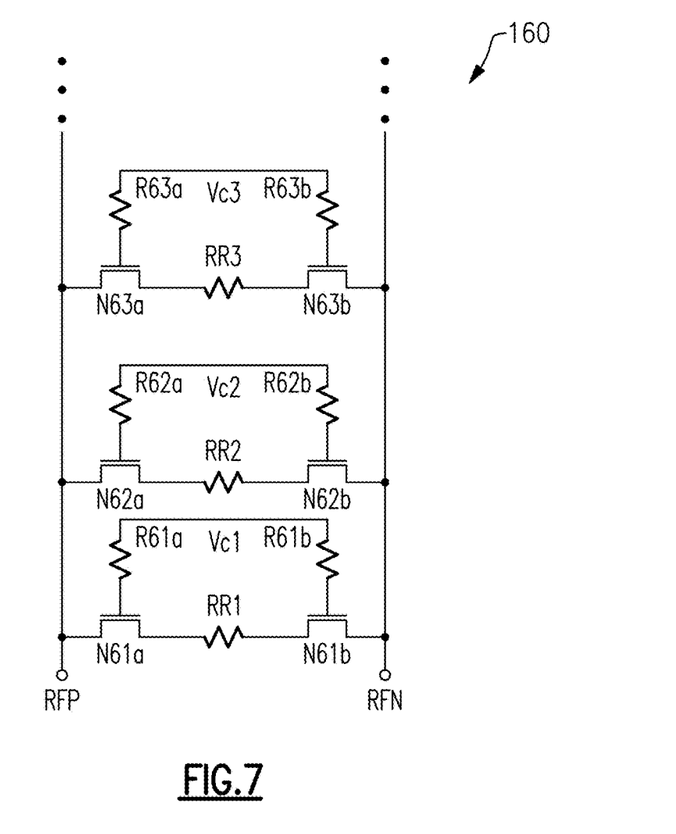
FIG. 7 is a schematic diagram of one embodiment of a gain control circuit for a bidirectional VGA.

FIG. 7 is a schematic diagram of one embodiment of a gain control circuit 160 for a bidirectional VGA. The gain control circuit 160 includes three resistance selection circuits for controlling the amount of resistance present between a first port RFP and a second port RFN. Although three resistance selection circuits are shown in this examples, more or fewer resistance selection circuits can be included as indicated by the ellipsis. Although one example of a gain control circuit is depicted, other implementations of gain control circuits can be used in a bidirectional VGA.

In certain implementations herein, gain adjustment is accomplished by a digitally-controlled resistor connected across the differential signal path. For example, that resistor could be implemented as a plurality of resistors connected or disconnected from the differential signal path by digitally-switched FETs In the illustrated embodiment, each resistance selection circuit includes a first FET, a resistor, and a second FET in series between the first port RFP and the second port RFN, with the gates of FETs biased with a control voltage using a pair of resistors. For example, as shown in FIG. 6, the first resistance selection circuit includes transistor N61a, resistor RR1, and transistor N61b in series between RFP and RFN, and bias resistors R61a and R61b for biasing the gates of N61a and N61b, respectively, with a first control voltage Vc1. Likewise, the second resistance selection circuit includes transistor N62a, resistor RR2, and transistor N62b in series between RFP and RFN, and bias resistors R62a and R62b for biasing the gates of N62a and N62b, respectively, with a second control voltage Vc2. Furthermore, the third resistance selection circuit includes transistor N63a, resistor RR3, and transistor N63b in series between RFP and RFN, and bias resistors R63a and R63b for biasing the gates of N63a and N63b, respectively, with a third control voltage Vc3. The values of the control voltages Vc1, Vc2, and Vc3 can be set by a bias and control circuit (for example, the bias and control circuit 125 of FIG. 5).

In certain implementations, the RF ports of the resistor, RFP and RFN, are DC-biased to a desired DC value (for example, a voltage Vsd). If Vc1, for example, is higher than Vsd, RR1 will be connected between RFP and RFN. Likewise, if Vc2 is higher than Vsd, RR2 will be connected between RFP and RFN. Similarly, if Vc3 is higher than Vsd, RR3 will be connected between RFP and RFN. In some implementations, the resistors all have identical values, while in other implementations they or their reciprocal conductance values can be weighted using binary weighting or another desired weighting scheme.

Figure 8:
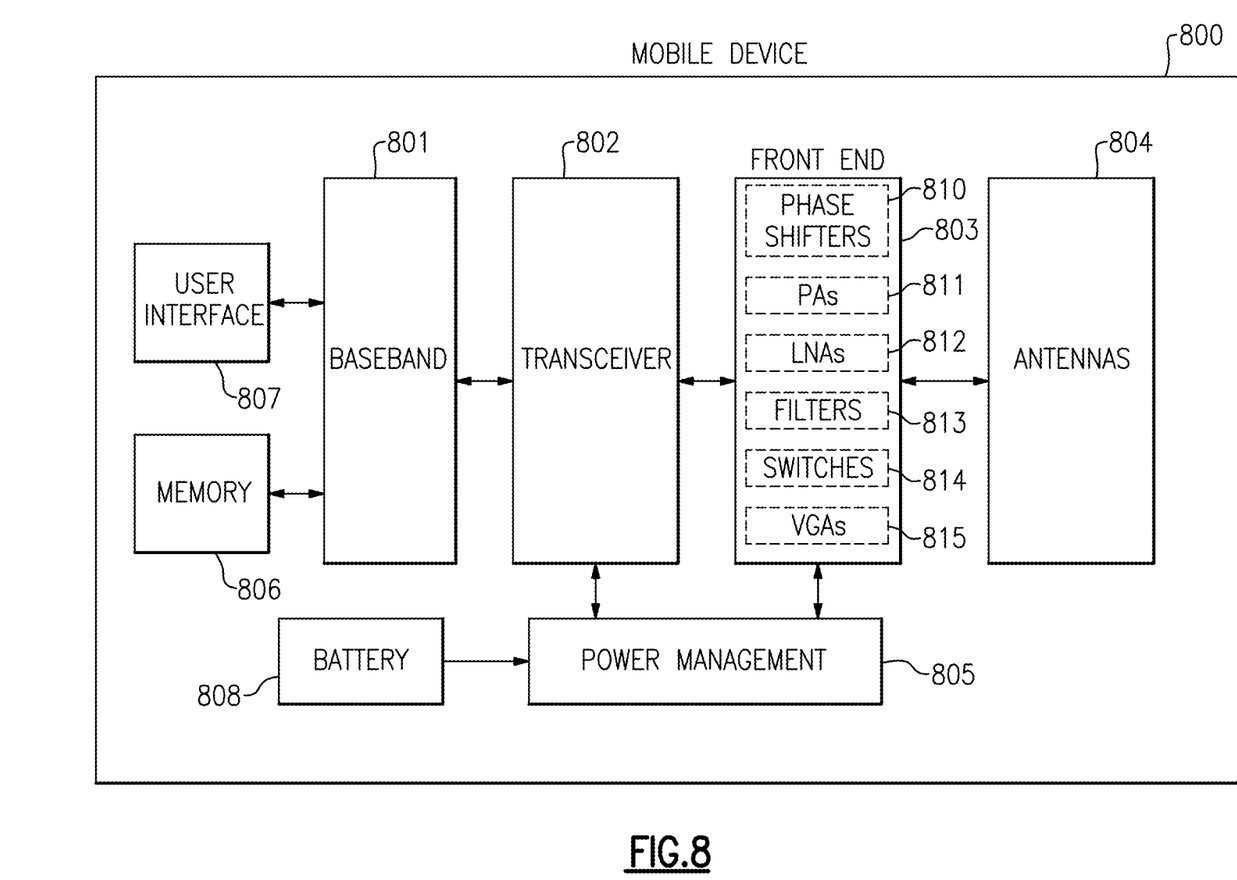
FIG. 8 is a schematic diagram of one embodiment of a mobile device.

FIG. 8 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, Wi-Fi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 8 as the transceiver 802. In one example, separate components (for instance, separate circuits or dies) can be provided for handling certain types of RF signals.

The front end system 803 aids in conditioning signals transmitted to and/or received from the antennas 804. In the illustrated embodiment, the front end system 803 includes phase shifters 810, power amplifiers (PAs) 811, low noise amplifiers (LNAs) 812, filters 813, switches 814, and VGAs 815. However, other implementations are possible.

For example, the front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

The mobile device 800 operates with beamforming. For example, the front end system 803 includes phase shifters 810 having variable phase controlled by the transceiver 802 and VGAs 815 having variable gain controlled by the transceiver 802. The VGAs 815 can include one or more bidirectional VGAs implemented in accordance with the teachings herein. In certain implementations, the transceiver 802 controls the phase of the phase shifters 810 and gain of the VGAs 815 based on data received from the processor 801.

The phase shifters 810 and VGAs 815 are controlled to provide beam formation and directivity for transmission and/or reception of signals using the antennas 804. For example, in the context of signal transmission, the phases and gains of the transmit signals provided to an antenna array used for transmission are controlled such that radiated signals combine using constructive and destructive interference to generate an aggregate transmit signal exhibiting beam-like qualities with more signal strength propagating in a given direction. In the context of signal reception, the phases and gains are controlled such that more signal energy is received when the signal is arriving to the antenna array from a particular direction.

The VGAs 815 can be implemented in accordance with any of the embodiments herein. Although FIG. 8 illustrates one example of a mobile device that can include phase shifters implemented in accordance with the teachings herein, the VGAs herein can be used in communication systems implemented in a wide variety of ways. Accordingly, other implementations are possible.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 8, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 8, the power management system 805 receives a battery voltage from the battery 808. The battery 808 can be any suitable battery for use in the mobile device 800, including, for example, a lithium-ion battery.

Figure 9:
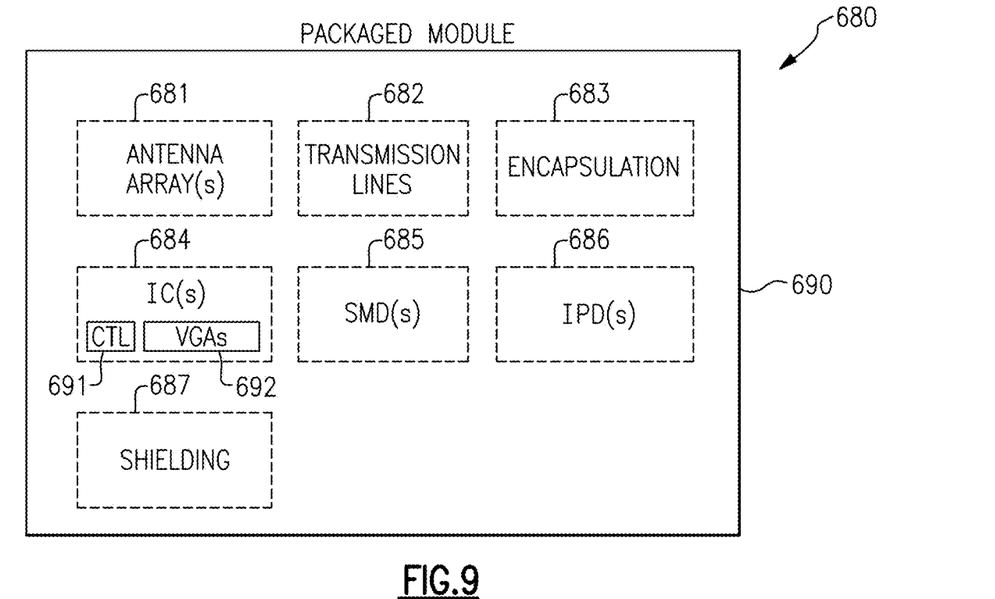
FIG. 9 is a plan view of one embodiment of a module.

FIG. 9 is a plan view of one embodiment of a module 680. The module 680 includes a substrate 690 as well as various structures formed on and/or attached to the substrate 690. For example, the module 680 includes antenna array(s) 681, phase shifting transmission lines 682, encapsulation 683, IC(s) 684 (including a control circuit 691 and VGAs 692, in this embodiment), surface mount device(s) or SMD(s) 685, integrated passive device(s) or IPD(s) 686, and shielding 687. The module 680 illustrates various examples of components and structures that can be included in a module of a communication device that includes one or more VGAs implemented in accordance with the teachings herein.

Although one example of a combination of components and structures is shown, a module can include more or fewer components and/or structures.

Figure 10A:
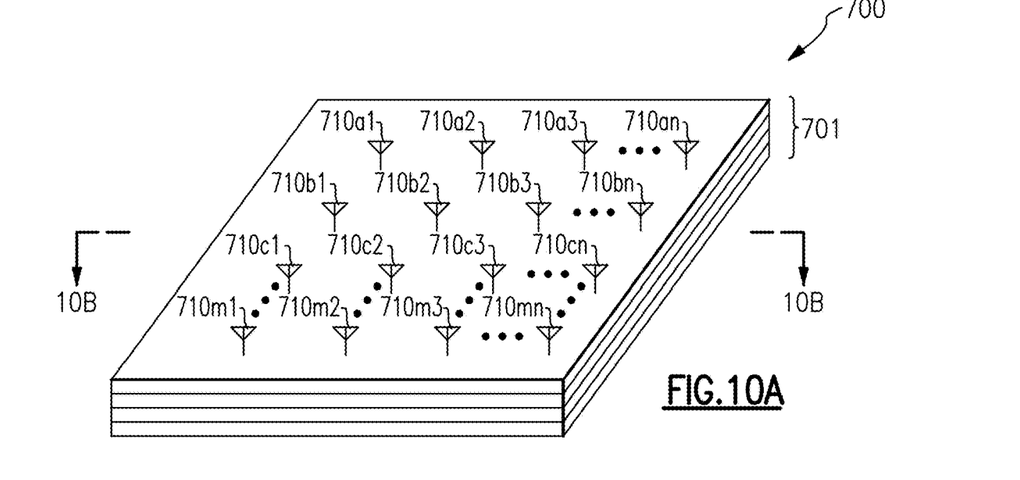
FIG. 10A is a perspective view of another embodiment of a module.
Figure 10B:
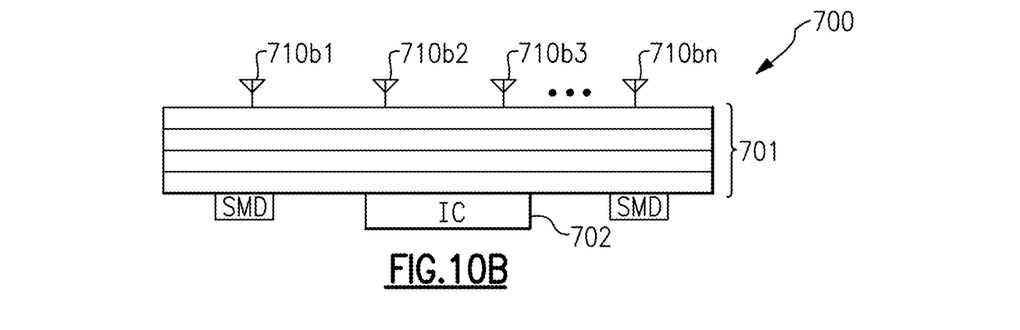
FIG. 10B is a cross-section of the module of FIG. 10A taken along the lines 10B-10B.

FIG. 10A is a perspective view of another embodiment of a module 700. FIG. 10B is a cross-section of the module 700 of FIG. 10A taken along the lines 10B-10B.

The module 700 includes a laminated substrate or laminate 701, a semiconductor die or IC 702 (not visible in FIG. 10A), SMDs (not visible in FIG. 10A), and an antenna array including antenna elements 710$a1$, 710$a2$, 710$a3$ . . . 710$an$, 710$b1$, 710$b2$, 710$b3$ . . . 710$bn$, 710$c1$, 710$c2$, 710$c3$ . . . 710$cn$, 710$m1$, 710$m2$, 710$m3$ . . . 710$mn$.

Although not shown in FIGS. 10A and 10B, the module 700 can include additional structures and components that have been omitted from the figures for clarity. Moreover, the module 700 can be modified or adapted in a wide variety of ways as desired for a particular application and/or implementation.

The antenna elements antenna elements 710$a1$, 710$a2$, 710$a3$ . . . 710$an$, 710$b1$, 710$b2$, 710$b3$ . . . 710$bn$, 710$c1$, 710$c2$, 710$c3$ . . . 710$cn$, 710$m1$, 710$m2$, 710$m3$ . . . 710$mn$ are formed on a first surface of the laminate 701, and can be used to receive and/or transmit signals, based on implementation. Although a 4×4 array of antenna elements is shown, more or fewer antenna elements are possible as indicated by ellipses. Moreover, antenna elements can be arrayed in other patterns or configurations, including, for instance, arrays using non-uniform arrangements of antenna elements. Furthermore, in another embodiment, multiple antenna arrays are provided, such as separate antenna arrays for transmit and receive.

In the illustrated embodiment, the IC 702 is on a second surface of the laminate 701 opposite the first surface. However, other implementations are possible. In one example, the IC 702 is integrated internally to the laminate 701.

In certain implementations, the IC 702 includes RF signal conditioning circuits associated with the antenna elements 710$a1$, 710$a2$, 710$a3$ . . . 710$an$, 710$b1$, 710$b2$, 710$b3$ . . . 710$bn$, 710$c1$, 710$c2$, 710$c3$ . . . 710$cn$, 710$m1$, 710$m2$, 710$m3$ . . . 710$mn$ and that include VGAs implemented in accordance with the teachings herein. Although an implementation with one semiconductor chip is shown, the teachings herein are applicable to implementations with additional chips.

The laminate 701 can include various structures including, for example, conductive layers, dielectric layers, and/or solder masks. The number of layers, layer thicknesses, and materials used to form the layers can be selected based on a wide variety of factors, and can vary with application and/or implementation. The laminate 701 can include vias for providing electrical connections to signal feeds and/or ground feeds of the antenna elements. For example, in certain implementations, vias can aid in providing electrical connections between RF signal conditioning circuits of the IC 702 and corresponding antenna elements.

The antenna elements 710$a1$, 710$a2$, 710$a3$ . . . 710$an$, 710$b1$, 710$b2$, 710$b3$ . . . 710$bn$, 710$c1$, 710$c2$, 710$c3$ . . . 710$cn$, 710$m1$, 710$m2$, 710$m3$ . . . 710$mn$ can correspond to antenna elements implemented in a wide variety of ways. In one example, the array of antenna elements includes patch antenna element formed from a patterned conductive layer on the first side of the laminate 701, with a ground plane formed using a conductive layer on opposing side of the laminate 701 or internal to the laminate 701. Other examples of antenna elements include, but are not limited to, dipole antenna elements, ceramic resonators, stamped metal antennas, and/or laser direct structuring antennas.

Applications

The principles and advantages of the embodiments described herein can be used for a wide variety of applications.

For example, VGAs can be included in various electronic devices, including, but not limited to consumer electronic products, parts of the consumer electronic products, electronic test equipment, etc. Example electronic devices include, but are not limited to, a base station, a wireless network access point, a mobile phone (for instance, a smartphone), a tablet, a television, a computer monitor, a computer, a hand-held computer, a personal digital assistant (PDA), a microwave, a refrigerator, an automobile, a stereo system, a disc player, a digital camera, a portable memory chip, a washer, a dryer, a copier, a facsimile machine, a scanner, a multi-functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A wireless device comprising:
an antenna array including a plurality of antenna elements;
a plurality of radio frequency signal conditioning circuits each operatively associated with a corresponding one of the plurality of antenna elements and including a bidirectional variable gain amplifier, the bidirectional variable gain amplifier including a first amplifier including an input connected to a transmit/receive port, a second amplifier including an output connected to a transmit port, a third amplifier including an input connected to a receive port, a fourth amplifier including an output connected to the transmit/receive port and to the input of the first amplifier, and a switch circuit configured to connect an output of the first amplifier to an input of the second amplifier in a transmit mode, and to connect an output of the third amplifier to an input of the fourth amplifier in a receive mode, the fourth amplifier being a first common-drain amplifier including a first transistor having a drain connected to a power supply voltage, a gate that is connected to the output of the third amplifier in the receive mode, and a source connected to the input of the first amplifier, the first amplifier including a first pair of input transistors and a second pair of input transistors that are selectable, the first pair of input transistors configured to provide a signal inversion when selected and the second pair of input transistors configured to provide no signal inversion when selected, a first transistor of the first pair of input transistors including a drain connected to a drain of a first transistor of the second pair of input transistors, and a source connected to a source of a second transistor of the second pair of input transistors; and
a transceiver connected to the plurality of radio frequency signal conditioning circuits.

2. The wireless device of claim 1 wherein the first amplifier is a first common-gate amplifier including a second transistor having a source directly connected to the source of the first transistor, a gate connected to a gate bias voltage, and a drain that is connected to the input of the second amplifier in the transmit mode.

3. The wireless device of claim 2 wherein the second amplifier is a second common-gate amplifier, and the third amplifier is a second common-drain amplifier.

4. The wireless device of claim 1 wherein the first amplifier includes a first pair of transistors having a first pair of sources, and the second amplifier includes a second pair of transistors having a second pair of sources directly connected to the first pair of sources.

5. The wireless device of claim 1 wherein the switch circuit includes a first switch and a second switch connected at a common node, the bidirectional variable gain amplifier further including a controllable resistor connected to the common node.

6. The wireless device of claim 1 wherein each of the plurality of radio frequency signal conditioning circuits further includes a phase shifter connected to the transmit/receive port.

7. The wireless device of claim 1 wherein each of the plurality of radio frequency signal conditioning circuits further includes a power amplifier having an input connected to the transmit port and a low noise amplifier having an output connected to the receive port.

8. A bidirectional variable gain amplifier comprising:
a first amplifier including an input connected to a transmit/receive port, the first amplifier including a first pair of input transistors and a second pair of input transistors that are selectable, the first pair of input transistors configured to provide a signal inversion when selected and the second pair of input transistors configured to provide no signal inversion when selected, a first transistor of the first pair of input transistors including a drain connected to a drain of a first transistor of the second pair of input transistors, and a source connected to a source of a second transistor of the second pair of input transistors;
a second amplifier including an output connected to a transmit port;
a third amplifier including an input connected to a receive port;
a fourth amplifier including an output connected to the transmit/receive port and to the input of the first amplifier, the fourth amplifier being a first common-drain amplifier including a first transistor having a drain connected to a power supply voltage, a gate that is connected to the output of the third amplifier in a receive mode, and a source connected to the input of the first amplifier; and
a switch circuit configured to connect an output of the first amplifier to an input of the second amplifier in a transmit mode, and to connect an output of the third amplifier to an input of the fourth amplifier in the receive mode.

9. The bidirectional variable gain amplifier of claim 8 wherein the first amplifier is a first common-gate amplifier including a second transistor having a source directly connected to the source of the first transistor, a gate connected to a gate bias voltage, and a drain that is connected to the input of the second amplifier in the transmit mode.

10. The bidirectional variable gain amplifier of claim 9 wherein the second amplifier is a second common-gate amplifier, and the third amplifier is a second common-drain amplifier.

11. The bidirectional variable gain amplifier of claim 8 wherein the first amplifier includes a first pair of transistors having a first pair of sources, and the second amplifier includes a second pair of transistors having a second pair of sources directly connected to the first pair of sources.

12. The bidirectional variable gain amplifier of claim 11 further comprising a pair of inductors connected to the first pair of sources and the second pair of sources, the pair of inductors configured to provide input matching to the first amplifier and output matching to the fourth amplifier.

13. The bidirectional variable gain amplifier of claim 8 wherein the switch circuit includes a first switch and a second switch connected at a common node.

14. The bidirectional variable gain amplifier of claim 13 further comprising a controllable resistor connected to the common node.

15. The bidirectional variable gain amplifier of claim 8 further comprising a bias and control circuit configured turn off the third amplifier and the fourth amplifier in the transmit mode, and to turn off the first amplifier and the second amplifier in the receive mode.

16. A front end system comprising:
a power amplifier;
a low noise amplifier; and
a bidirectional variable gain amplifier including a first amplifier including an input connected to a transmit/receive port, a second amplifier including an output connected to an input of the power amplifier at a transmit port, a third amplifier including an input connected to an output of the low noise amplifier at a receive port, a fourth amplifier including an output connected to the transmit/receive port and to the input of the first amplifier, and a switch circuit configured to connect an output of the first amplifier to an input of the second amplifier in a transmit mode, and to connect an output of the third amplifier to an input of the fourth amplifier in a receive mode, the fourth amplifier being a first common-drain amplifier including a first transistor having a drain connected to a power supply voltage, a gate that is connected to the output of the third amplifier in the receive mode, and a source connected to the input of the first amplifier, the first amplifier including a first pair of input transistors and a second pair of input transistors that are selectable, the first pair of input transistors configured to provide a signal inversion when selected and the second pair of input transistors configured to provide no signal inversion when selected, a first transistor of the first pair of input transistors including a drain connected to a drain of a first transistor of the second pair of input transistors, and a source connected to a source of a second transistor of the second pair of input transistors.

17. The front end system of claim 16 wherein the first amplifier is a first common-gate amplifier including a second transistor having a source directly connected to the source of the first transistor, a gate connected to a gate bias voltage, and a drain that is connected to the input of the second amplifier in the transmit mode.

18. The front end system of claim 17 wherein the second amplifier is a second common-gate amplifier, and the third amplifier is a second common-drain amplifier.

* * * * *